US006570561B1

(12) United States Patent  
Boesch et al.

(10) Patent No.: US 6,570,561 B1
(45) Date of Patent: May 27, 2003

(54) PORTABLE COMPUTER WITH LOW VOLTAGE DIFFERENTIAL SIGNALING ADAPTER

(75) Inventors: Shannon C. Boesch, Georgetown, TX (US); Charles L. Haley, Temple, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1200 days.

(21) Appl. No.: 08/664,089

(22) Filed: Jun. 14, 1996

(51) Int. Cl.[7] ................................................. G06F 1/30
(52) U.S. Cl. ...................................... 345/213; 713/321
(58) Field of Search ................................ 345/211, 212, 345/213, 507, 501, 214, 90; 395/700, 308; 324/158.1; 713/321, 322, 323

(56) References Cited

U.S. PATENT DOCUMENTS 5,285,197 A * 2/1994 Schmidt et al. ............. 345/213
5,406,199 A * 4/1995 Shad ......................... 324/158.1
5,493,657 A * 2/1996 Van Brun et al. ........... 395/308
5,513,359 A * 4/1996 Clark et al. ................. 345/750
5,559,448 A * 9/1996 Koenig ....................... 326/30
5,559,954 A * 9/1996 Sakoda et al. .............. 395/501
5,598,565 A * 1/1997 Reinhardt ................... 395/750

OTHER PUBLICATIONS

DS90C561/DS90C562 LVDS 18 Bit Color Host–LCD Panel Interface, Rev. 2.1, National Semiconductor, May 12, 1995.

* cited by examiner

Primary Examiner—Cao H. Nguyen
(74) Attorney, Agent, or Firm—Ronald O. Neerings; Wade James Brady, III; Frederick J. Telecky, Jr.

(57) ABSTRACT

A computer (10) uses a TTL-to-LVDS converter board (34) coupled to a graphics controller (32). The graphics controller (32) outputs video information using TTL logic levels. The TTL-to-LVDS converter board (34) is coupled to the graphics controller using a cable and is preferably located proximate the graphics controller (32) to minimize cable length. A display (20) is coupled to the TTL-to-LVDS converter board (34).

23 Claims, 4 Drawing Sheets

PORTABLE COMPUTER WITH LOW VOLTAGE DIFFERENTIAL SIGNALING ADAPTER

BACKGROUND OF THE INVENTION

1. Technical Field

This invention relates in general to computers and, more particularly, to a portable computer with a low voltage differential signaling adapter.

2. Description of the Related Art

For many years, the popularity of portable computers has risen as the size and weight of the portable computer has been reduced. Early portable computers were known as "luggable" computers, since they could be transported, but were only slightly smaller and lighter than comparable desktop computers. "Laptop" computers were smaller and lighter, but generally had reduced features and flexibility because most of the circuitry needed to be designed into the laptop motherboard without the option of expansion boards.

Notebook computers are significantly smaller and lighter than laptop computers. These computers can easily be carried in a briefcase. The widening use of multimedia in notebook computer systems has put increasing demands on notebook video systems. One area in which notebook computers are less desirable than their desktop countertops is in the video display. While CRT (cathode ray tube) displays commonly can handle resolutions of 1280×1024 and color depths of 16.7 million colors, LCD (liquid crystal display) panels are generally limited to VGA (640×480) and SVGA (800×600).

New LCD displays can handle higher resolutions. The enhanced resolution of the new displays, however, requires a higher data bandwidth to pass data from the graphics controller to the display. The need for a higher data bandwidth presents significant problems for the system designer. Increasing the number of lines between the graphics controller, which is housed in the main housing, and the display, which is typically housed in a separate housing coupled to the main housing through hinges, would enlarge the cable which passes through the hinges. In many cases, increasing the cable size presents serious problems to the system designer. Increasing the data rate between the graphics controller and the display would result in an increase in EMI (electromagnetic interference) emissions. Since these emissions are among the most difficult to control, this approach is also not feasible.

Higher data rates could be achieved using low voltage differential signaling (LVDS), which would significantly lower the EMI, thereby allowing higher data rates without exceeding FCC (Federal Communications Commission) limits on EMI emissions. LVDS uses a differential pair to transmit each signal. In contrast, CMOS(complementary metal on silicon)/ TTL (transistor to transistor logic) logic uses a single signal line to transmit each signal; the line's voltage is measured relative to a common ground to determine whether the signal is a logical high or a logical low. Typical thresholds for a CMOS/TTL logical high signal are voltages at or above approximately 2.0 volts and thresholds for a CMOS/TTL logical low signal are at or below approximately 0.8 volts. By contrast, LVDS signaling uses ±345 millivolt swings to represent logical high and low voltages. Since current notebook designs are based on CMOS/TTL logic levels, and since current graphics controllers do not support LVDS outputs, use of the enhanced resolution panels requires a significant redesign of the system circuitry.

Therefore, a need has risen for a computer which uses LVDS signaling without significant redesign.

SUMMARY OF THE INVENTION

The present invention provides a computer comprising a processor coupled to a graphics controller for outputting video information defined using a first signal type. A translation board is removably coupled to the graphics controller for receiving video information defined using the first signal type and outputting video information defined using a second signal type. A display is coupled to the translation board for receiving the video information defined using the second signal type.

The present invention provides significant advantages over the prior art. First, higher resolution displays can be used with an existing system board design, since the translation board can drive an enhanced display while connected to a graphics controller used to drive normal VGA and SVGA displays. The translation board can convert TTL signals from the graphics controller to LVDS signaling, which allows a faster transmission of signals to the display over fewer lines and with less EMI emissions.

Second, the translation board allows the same system board design to be used for both regular VGA and SVGA display panels and for higher resolution panels. In a design which does not require the enhanced outputs, the display can be connected directly to the graphics controller without signal translation. Thus, purchasers who do not need an enhanced display, which comprises a large portion of the overall cost of a notebook computer, can purchase a computer configured with a less expensive display, without purchasing the translation board. For systems using an enhanced resolution display, the translation board can be mounted on the board carrier and connected between the graphics controller and the display. Consequently, a single design can support multiple display types without reserving space on the system boards for LVDS circuitry and without providing multiple connectors for different display types.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENT

The present invention is best understood in relation to FIGS. 1–5 of the drawings, like numerals being used for like elements of the various drawings.

Figure 1:
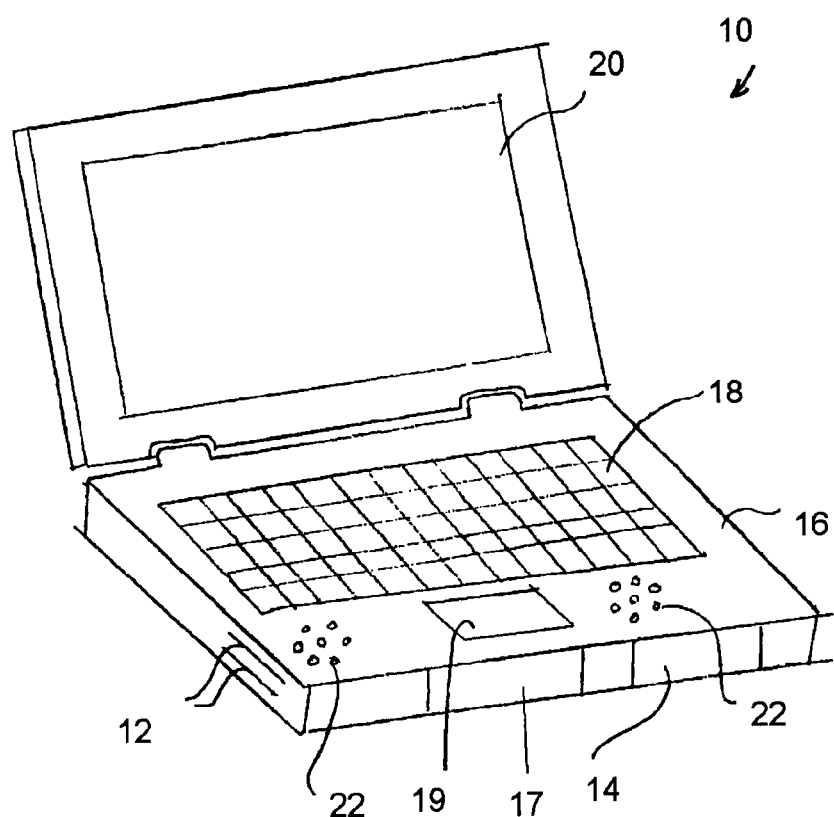
FIG. 1 is a perspective view of a notebook computer.

FIG. 1 illustrates a perspective view of a computer system 10 having two PC Card slots 12 for receiving PCMCIA and CardBus devices and a modular bay 14 for receiving one of a plurality of modular devices, such as a floppy drive, hard disk drive, CD-ROM drive, magneto-optical (MO) drive, battery, or cellular telecommunication device. The computer system 10 includes a main housing 16, within which the computer electronics are housed. The PC Card slots 12 and modular bay 14 are accessible through the housing. A battery 17 is placed next to the modular bay 14. A keyboard 18 is placed at the top of the main housing 16. Keyboard 18, in the preferred embodiment, includes a pointing device, such as touch pad 19. A display 20 is attached to the main housing 16. Typically, the display 20 is connected to the main housing 16 by a hinge, such that the display 20 can be folded away from the main housing 16 while the computer 10 is in use and folded flush with the main housing 16 for portability when the computer 10 is inactive. For a multimedia computer, speakers 22 are shown as provided in the main housing 16.

While FIG. 1 illustrates a specific notebook computer design, it should be noted that many modifications could be made. For example, many different pointing devices could be used, such as a mouse, a trackball or an integrated joystick. Other features, such as speakers, are optional and not needed to practice the present invention, as would be known to one skilled in the art. The arrangement of the components of the computer could also be modified by the system designer.

Figure 2:
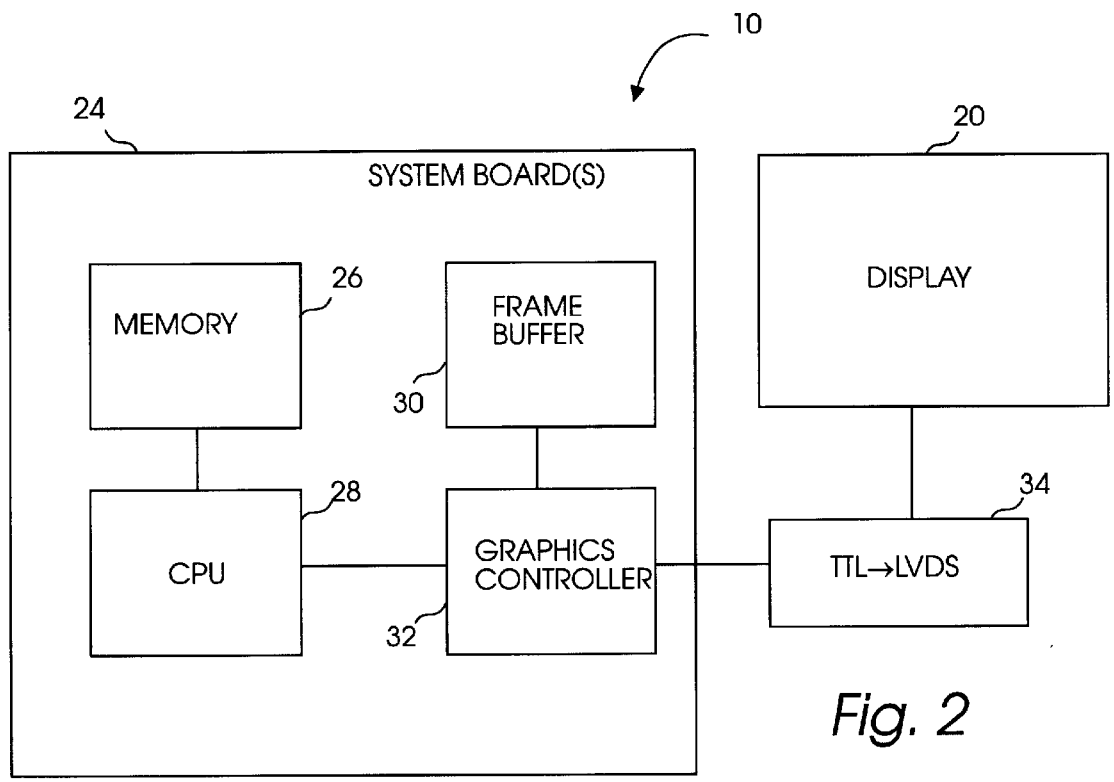
FIG. 2 is a block diagram of a translation circuit for connecting an existing system board design to an enhanced panel display.

FIG. 2 illustrates a block diagram of a preferred embodiment for modifying an existing notebook circuit to work with an enhanced flat panel display using LVDS signaling to reduce EMI and increase data bandwidth to the display 20. The system board 24 can be an existing design using TTL level signals to transmit data to the display. The system board (or boards) would provide the memory 26, CPU 28, frame buffer 30 and graphics controller 32. For purposes of illustration, other components normally found on the system board 24 are not shown, such as the BIOS (basic input output system), bus controller, chipset, I/O circuitry, IDE (integrated drive electronics) interface, modem and so on. Such circuitry can be of conventional design, as would be known to one skilled in the art.

As in typical computer designs, the graphics controller 32 reads information from the frame buffer 30 and outputs video data to a display. In the present design, however, the output of the graphics controller 32 is not passed directly to the display 20. Instead, the output of the graphics controller 32 is passed to a TTL-to-LVDS converter 34. The output of the TTL-to-LVDS converter 34 is coupled to the display 20.

In operation, TTL signals from the graphics controller are translated to LVDS signals by the TTL-to-LVDS converter 34, which passes the LVDS signals to the display 20. Because the output of the TTL-to-LVDS converter 34 has low EMI emissions, the throughput can be increased to support higher resolutions and color depths.

Figure 3:
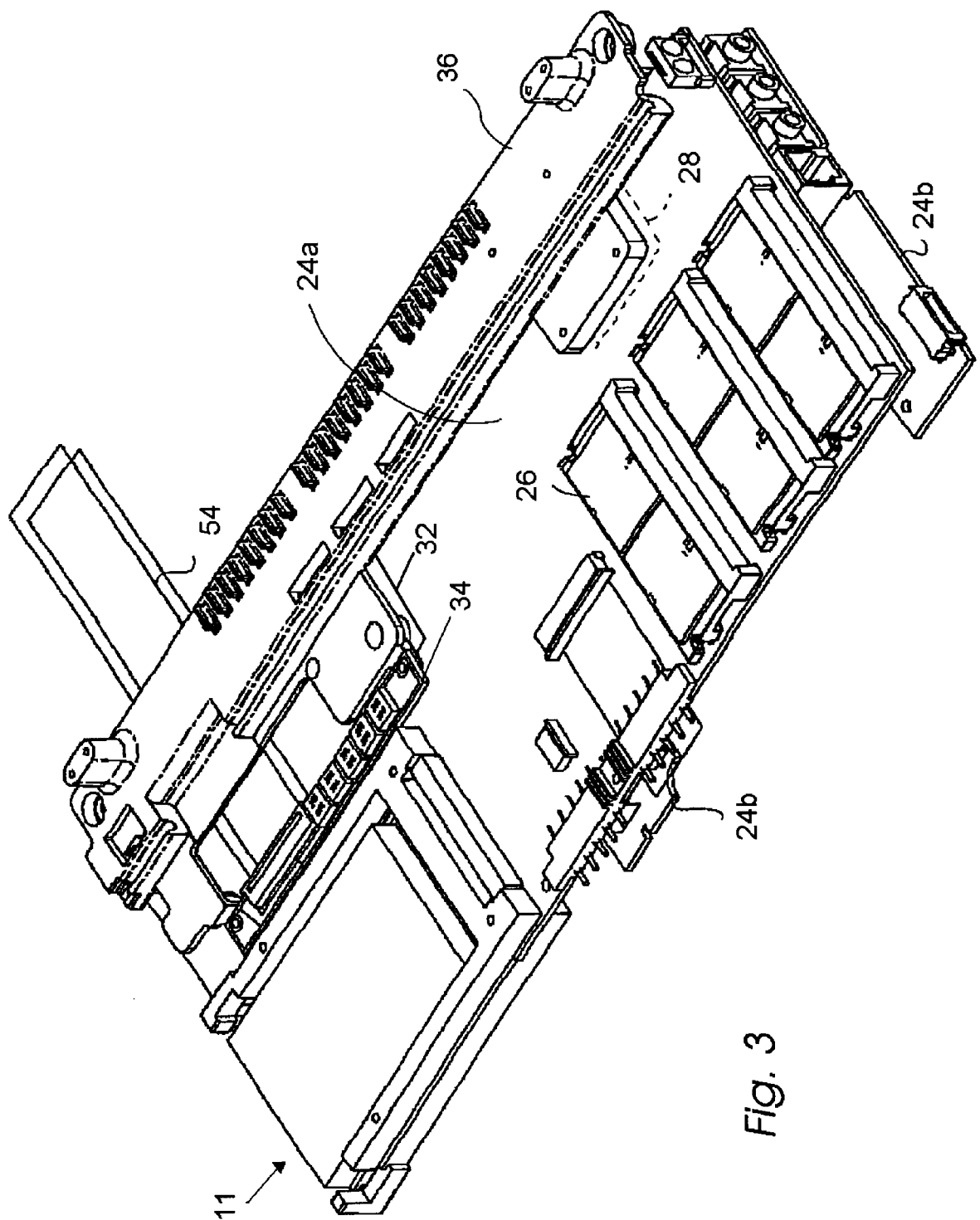
FIG. 3 is a perspective view of the circuit board of FIG. 2 mounted to a circuit board carrier with the system boards.

FIG. 3 illustrates a perspective view of the TTL-to-LVDS converter 34 and system board 24 mounted in a circuit board carrier 36 which attaches to the main housing 16. In the embodiment shown in FIG. 3, the system boards 24 comprise a top board 24a and a bottom board 24b which are coupled together with a flex cable.

The top board 24a contains the microprocessor 28 (shown on the opposite side of circuit board 24a), memory 26, graphics controller 32 and PCI bus circuitry (not shown). PC Card peripheral slot assemblies 11 are also connected to the top board 24a. Bottom board 24b contains the power supply circuitry, BIOS (basic input/output system), modem and modular bay circuitry. A bus/VGA board (not shown) provides connectors for the docking station and an external display. The allocation of functions between boards is a matter of design preference and the functions of the various boards mounted to the carrier 36 could vary from that described herein.

In the preferred embodiment, the board carrier 36 is also used for heat transfer from the system components. This aspect is described in greater detail in connection with U.S. app. Ser. No 08/656,800 entitled "Heat Frame for Portable Computer" to Altic et al, filed May 31, 1996, which is incorporated by reference herein.

Figure 4:
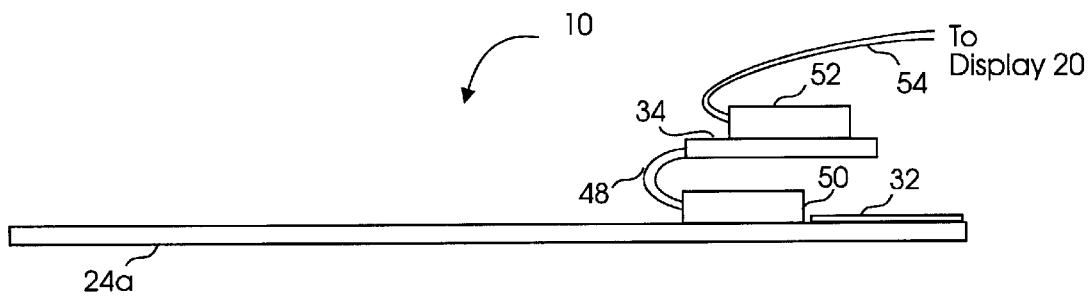
FIG. 4 is a side view of the connections between the system board and the translation circuit.

As is shown in greater detail in connection with FIG. 4, the TTL-to-LVDS converter 34 is coupled to the carrier 36 directly above the location of the graphics controller 32 in order to minimize the length of the flex cable 48 between the display connector 50, which is coupled to the graphics controller 32, and the TTL-to-LVDS converter 34. Location of the TTL-to-LVDS converter 34 is important because of the EMI emissions which escape the flex cable 48, which is carrying CMOS/TTL signals. By minimizing the length of flex cable 48, EMI emissions are reduced. Therefore, it is desirable that the carrier 36 mount the TTL-to-LVDS converter 34 as close to the display connector 50 as possible. Similarly, the graphics controller 32 should be located as close to the display connector as possible.

The TTL-to-LVDS converter 34 includes a display connector 52 which couples to the cable 54 from the display 20.

While FIGS. 3 and 4 illustrate one specific configuration of connecting the TTL-to-LVDS converter 34 to the graphics controller 32, other configurations could be used. For example, the TTL-to-LVDS converter 34 could use a connector which mounts directly to the display connector 50 without the use of a cable.

Similarly, while the embodiment described herein uses a TTL-to-LVDS converter 34, translations between other signaling protocols would also be possible.

In the preferred embodiment, the TTL-to-LVDS converter 34 is grounded to the carrier 36, along with the system boards 24. The carrier provides a large ground plane which reduces EMI emissions.

Significant advantages are achieved by placing the TTL-to-LVDS converter 34 on a separate board which is connected between the display connector 50 and the display 20. First, higher resolution displays can be used with an existing system board design, since the TTL-to-LVDS converter 34 connects to the display connector 50, which is normally used to connect the graphics controller 32 directly to the display 20. The TTL-to-LVDS converter 34 converts signals from the graphics controller 32 to LVDS signaling, which allows a faster transmission of signals to the display 20 over fewer lines and with less EMI emissions.

Second, the same system board design can be used to support both regular VGA and SVGA display panels and enhanced resolution panels. In a design which does not require LVDS outputs to reduce EMI emissions, the display 20 is connected directly to the display connector 50. In this case, the TTL-to-LVDS converter 34 is not mounted on the board carrier 36. Thus, purchasers who do not need an enhanced display, which comprises a large portion of the overall cost of a notebook computer, can purchase a computer with a less expensive display, without purchasing the TTL-to-LVDS converter 34. On systems using an enhanced resolution display, the TTL-to-LVDS converter 34 is mounted on the board carrier and connected to the display connector 50. The display 20 is then connected to the TTL-to-LVDS converter 34 at connector 52.

This aspect is an advantage not only to the purchaser, but to the system designer as well. Using the TTL-to-LVDS converter 34 on a separate board which is connected to the display connector 50, a single design can support multiple display types without reserving space on the system boards for LVDS circuitry and without providing-multiple connectors for different display types.

Figure 5:
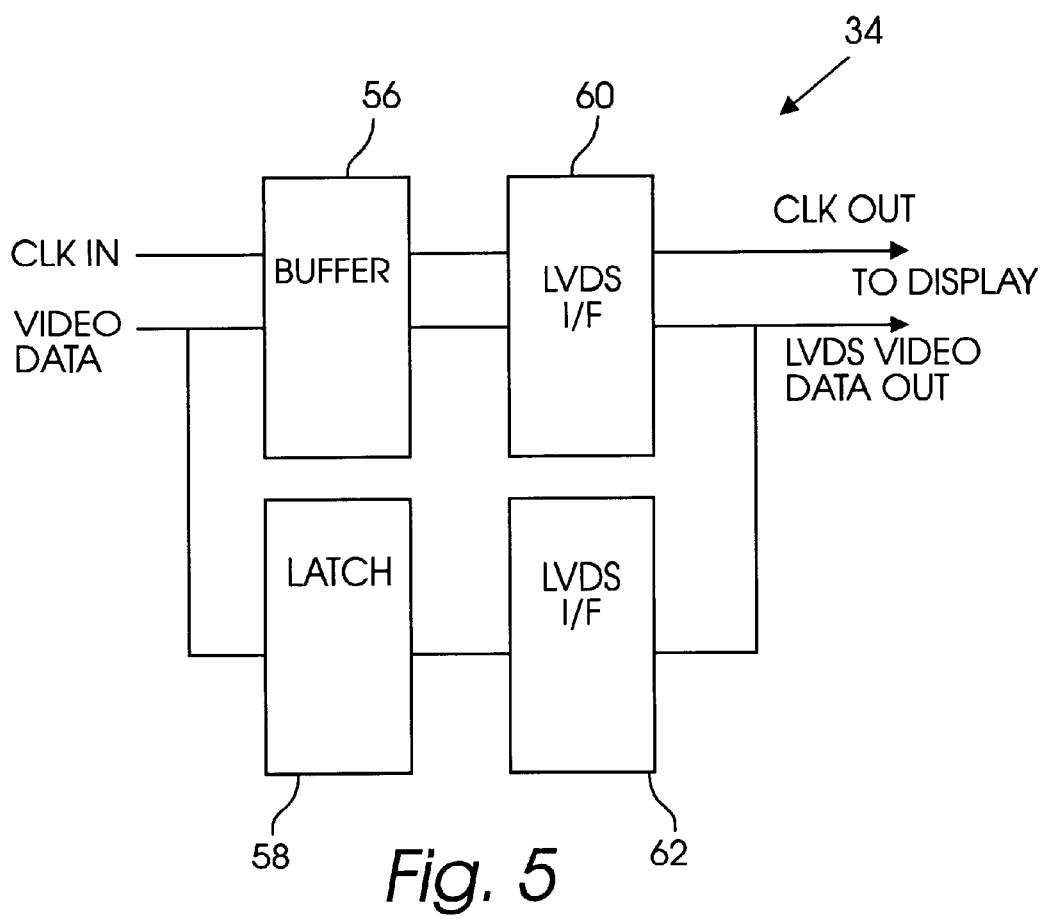
FIG. 5 is a block diagram of the translation board.

FIG. 5 illustrates a block diagram of a preferred embodiment of the TTL-to-LVDS converter 34. Video data from the graphics controller 32 is input to buffer 56 and latch 58. The output of buffer 56 is coupled to LVDS interface 60 and the output of latch 58 is coupled to LVDS interface 62. A transmit clock from the graphics controller 32 is input to buffer 56 and passed to LVDS interface 60. The outputs of the LVDS interfaces 60 and 62 are output to the display 20.

In order to reduce the clock rate at the output of the TTL-to-LVDS converter 34, information for odd and even pixels are output simultaneously from interfaces 60 and 62, respectively. Latch 58 latches even pixels on the rising edge of the system clock. Buffer 56 passes both even and odd pixels, although only odd pixels are clocked into interface 60. Buffer 56 acts to balance the propagation delay between interfaces 60 and 62. The LVDS interfaces 60 and 62 translate the CMOS/TTL logic levels from buffer 56 and latch 58 and output LVDS data streams.

LVDS interfaces 60 and 62 can be DS9OC561 transmitters. These devices convert 21 bits of CMOS/TTL data (including three bits of control data, namely HSYNC, VSYNC and DATA ENABLE) into three LVDS data streams. A phase-locked transmit clock is transmitted in parallel with the data streams over a fourth LVDS link. For each cycle of CLK IN, 21 bits of video data are sampled and transmitted over the three output lines. A corresponding circuit, the DS9OC562 receiver can be used as part of the display circuitry to return the signals to TTL voltage levels, if necessary.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the claims.

What is claimed is:

1. A computer comprising:
   a processor;
   a graphics controller coupled to said processor for outputting video information defined using a first signal type;
   a translation board removably coupled to said graphics controller for receiving said video information defined using said first signal type and outputting video information defined using a second signal type; and
   a display coupled to said translation board for receiving said video information defined using said second signal type.

2. The computer of claim 1 wherein said video information defined using said first signal type comprises video information defined using TTL logic levels.

3. The computer of claim 2 wherein said video information defined using said second signal type comprises video information defined using low voltage differential signaling.

4. The computer of claim 1 and further comprising a display connector coupled to said graphics controller.

5. The computer of claim 4 and further comprising a cable coupled to said translation board for connection with said display connector.

6. The computer of claim 5 wherein said display connector comprises a first display connector and further comprising a second display connector coupled to said translation board for connection with said display.

7. The computer of claim 1 wherein said translation board comprises:
   a plurality of input nodes;
   buffer circuitry coupled to said input nodes for regenerating signals on said nodes; and
   converter circuitry coupled to said buffer circuitry for converting video information of said first signal type to video information of said second data type.

8. The computer of claim 1 wherein said translation board is locate proximate said graphics controller.

9. The computer of claim 1 wherein said computer is a portable computer.

10. The computer of claim 1 wherein said display is an LCD display.

11. A method of display video information on a display comprising the steps of:
    generating video information of a first signal type using a graphics controller;
    translating the video information of the first signal type to video information of a second signal type using a board removably coupled to said graphics controller; and
    passing the video information of the second signal type to the display.

12. The method of claim 9 wherein said step of generating video information of the first signal type comprises the step of generating TTL logic level video information.

13. The method of claim 12 wherein said translating step comprises the step of translating TTL logic video information to LVDS video information.

14. The method of claim 11 wherein said passing step comprises the step of passing the video information of the second signal type to a flat panel display.

15. The method of claim 14 wherein said passing step comprises the step of passing the video information of the second signal type to a flat panel LCD display.

16. A computer comprising:
    a processor;
    a graphics controller coupled to said processor for outputting video information defined by CMOS/TTL logic levels;
    a translation board removably coupled to said graphics controller for receiving said CMOS/TTL logic levels and generating an LVDS data stream responsive thereto.

17. The computer of claim 16 wherein a first display for receiving video information in CMOS/TTL logic levels can be coupled to said graphics processor and an alternative second display can be coupled to said translation board for receiving said LVDS data stream.

18. The computer of claim 16 and further comprising a display connector coupled between said translation board and said graphics controller.

19. The computer of claim 16 wherein said display is a flat panel display.

20. The computer of claim 19 wherein said display is an LCD flat panel display.

21. The computer of claim 16 wherein said computer is a portable computer.

22. The computer of claim 16 wherein said display is an LCD display.

23. A computer comprising:

a processor;

a graphics controller coupled to said processor for outputting video information defined using a first signal type;

a translation board removably coupled to said graphics controller for receiving said video information defined using said first signal type and outputting video information defined using a second signal type; and a display coupled to one of said graphics controller for receiving said video information defined using said first signal type and said translation board for receiving said video information defined using said second signal type.

* * * * *